United States Patent

Betts

[11] 4,021,616
[45] May 3, 1977

[54] INTERPOLATING RATE MULTIPLIER

[75] Inventor: William L. Betts, St. Petersburg, Fla.

[73] Assignee: NCR Corporation, Dayton, Ohio

[22] Filed: Jan. 8, 1976

[21] Appl. No.: 647,534

[52] U.S. Cl. .................. 179/15 BV; 179/15 AF; 179/15.55 T
[51] Int. Cl.[2] .......................... H04L 25/16
[58] Field of Search ........ 179/15 BV, 15 BA, 15 A, 179/15 AF, 15.55 T; 178/50

[56] References Cited

UNITED STATES PATENTS

| 3,238,298 | 3/1966 | Willis | 178/50 |
| 3,261,001 | 7/1966 | Magnin | 178/50 |
| 3,480,734 | 11/1969 | Kuroyanagi | 178/50 |
| 3,794,768 | 2/1974 | Carney | 179/15 BV |

Primary Examiner—David L. Stewart
Attorney, Agent, or Firm—J. T. Cavender; Thomas A. Stansbury; Lowell C. Bergstedt

[57] ABSTRACT

Multiplexed pulse code modulation (PCM) signals are filtered by interpolation and, at the same time, converted between different pulse code modulation sampling rates.

17 Claims, 3 Drawing Figures

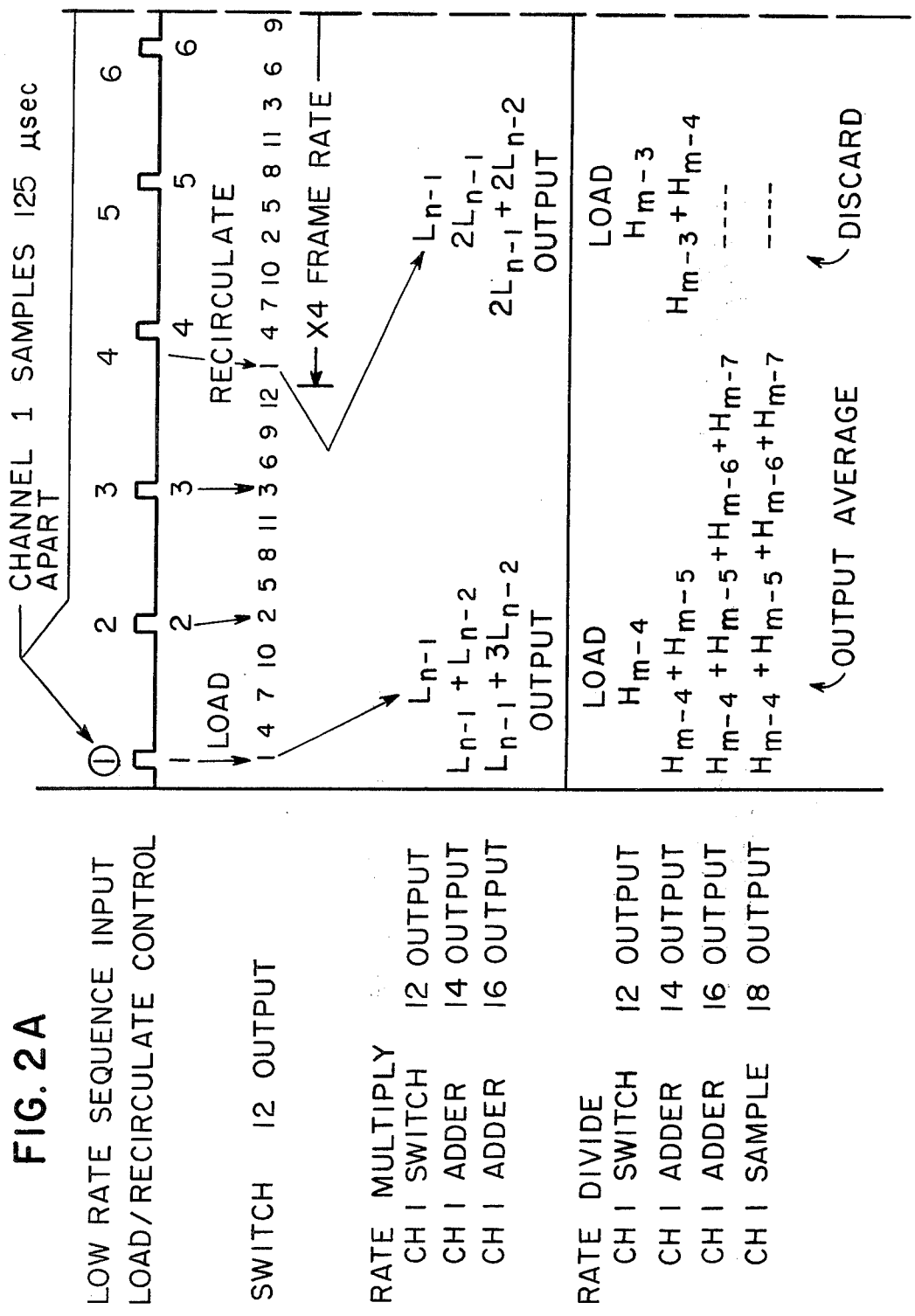

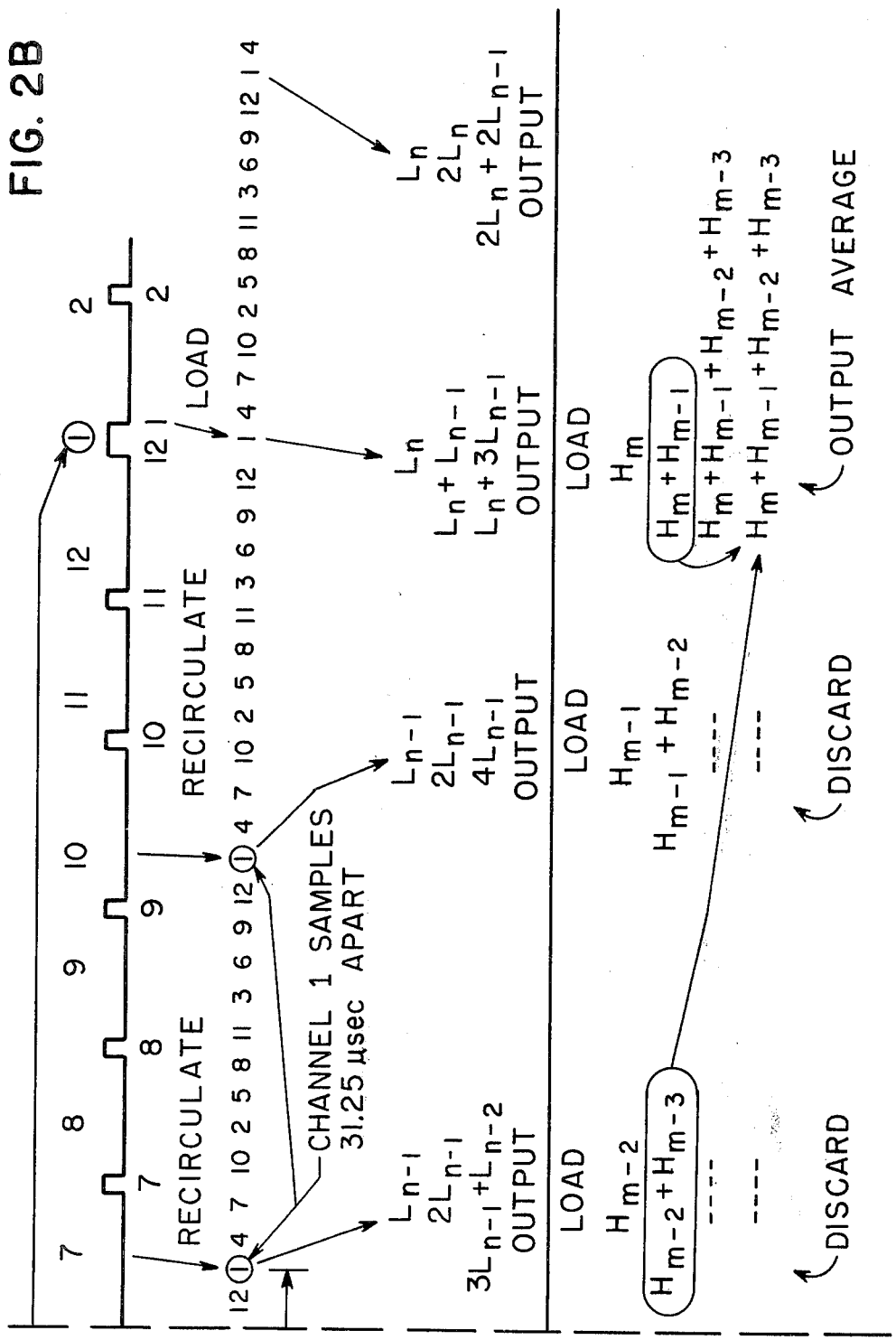

INTERPOLATING RATE MULTIPLIER

BACKGROUND OF THE INVENTION

1. Field of the Invention

The present invention relates to pulse code modulation digital filters and more particularly to a digital filter system which converts between different sampling rates while accomplishing digital filtering by interpolation.

2. Description of the Prior Art

Digital filtering of pulse code modulation systems has been accomplished in the past by circuitry directed to this purpose. Other circuits have been devised to convert between different rates of pulse code modulation. However, combined circuitry that can accomplish the digital filtering code rate conversion (both increasing and decreasing) and the processing of multiplex channels has not been previously devised.

SUMMARY OF THE INVENTION

The interpolating rate multiplier disclosed herein is used to change the sampling rates in sample data systems. It converts between sampling rates such as 8 KHz and 32 KHz. The 8 KHz rate has been universally accepted for use in contemporary digitized voice telephonic equipment. The 32 KHz rate has been accepted for use in all digital tri-service military communications equipment. 64 KHz and 32 KHz are also being considered for use in new commercial systems. Conversions between these rates and other rates are all possible in the use of the present invention.

It is, therefore, an object of the present invention to provide a new and improved digital filter for pulse code modulation signals.

Another object is to provide an interpolator for multiplexed pulse code modulation channels which alternatively multiplies or divides pulse code modulation rates.

BRIEF DESCRIPTION OF THE DRAWINGS

These and other objects of the invention will become apparent from the following description taken in connection with the drawings, in which:

FIG. 2 (comprised of FIG. 2A and 2B) is a timing and sequence diagram illustrating the operation of the preferred embodiment of the invention illustrated in FIG. 1.

DESCRIPTION OF THE PREFERRED EMBODIMENT

Figure 1:
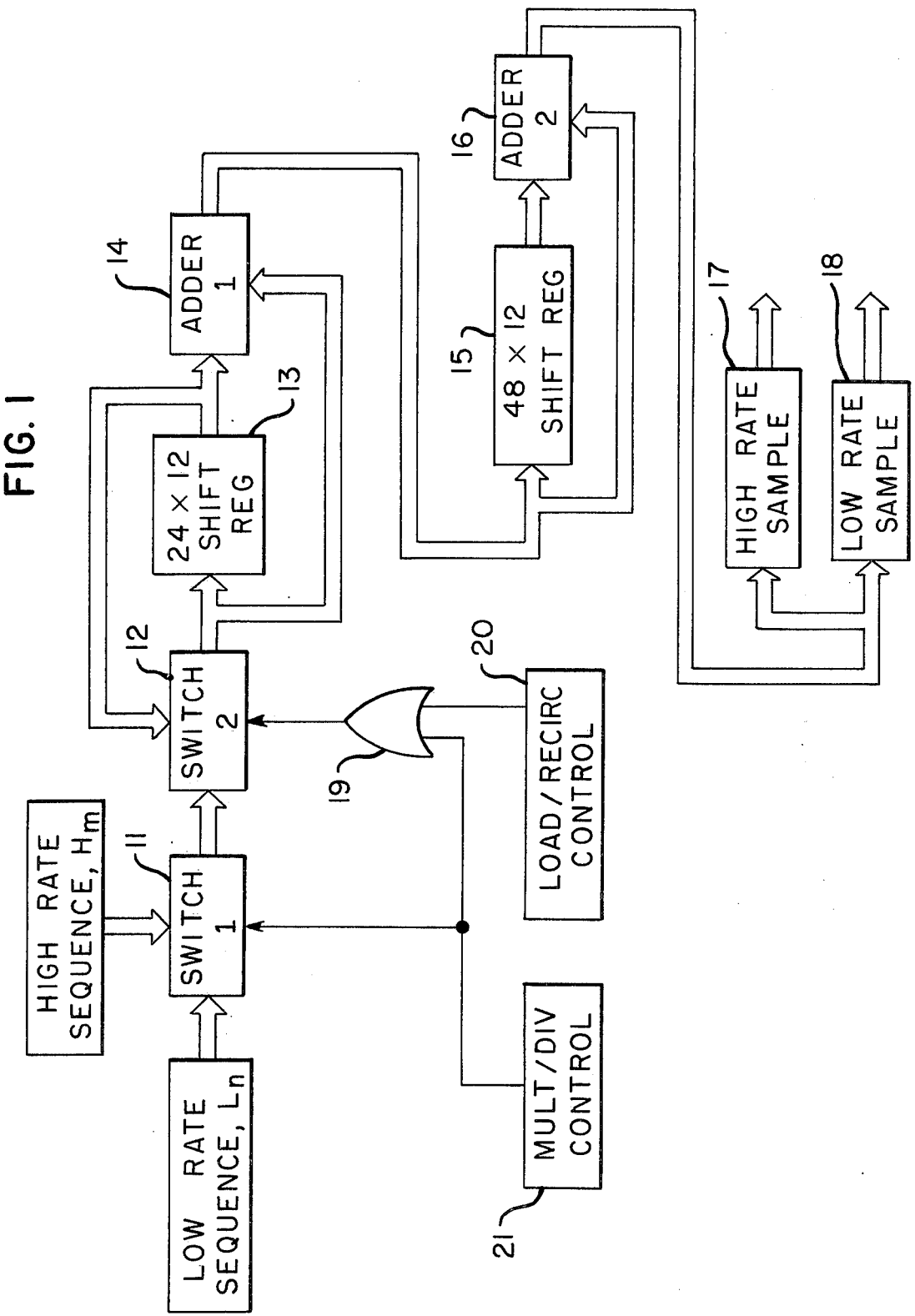
FIG. 1 is a schematic diagram of a preferred embodiment of the invention.

While this invention is susceptible of embodiments in many different forms, there is shown in the drawings and will herein be described in detail, an embodiment of the invention with the understanding that the present disclosure is to be considered as an exemplification of the principles of the invention and is not intended to limit the invention to the embodiment illustrated. The scope of the invention will be pointed out in the appended claims.

The numerical values of the PCM signals as well as the waveforms are shown in FIG. 2 to facilitate the understanding of the present disclosure. The interpolator illustrated in FIG. 1 is an interpolating rate multiplier which is used to change sampling rates of sample data systems, as well as performing the interpolation function. The interpolating rate multiplier illustrated in FIG. 1 converts between sampling rates of 8 KHz and 32 KHz. As aforestated, the 8 KHz rate has been universally accepted for use in contemporary digital voice telephone equipment; the 32 KHz rate has been accepted for use in the new all digital tri-service military communication equipment; and 64 KHz and 32 KHz are also being considered for use in new commerical systems. Those skilled in the art will recognize that conversions to other rates are possible using the techniques illustrated by the system of FIG. 1. The interpolating rate multiplier operates on time division multiplexed data streams. The input and output sequences contain 12 channels each and handle PCM signals of twelve bits. A low rate sequence $L_n$ is 96 K samples per second. A high rate sequence $H_m$ data rate is 384 K samples per second. The interpolating rate multiplier operates on both numerical streams to multiply and divide sampling rates. The combined data rate is 768 K samples per second. As shown in FIG. 1, 24 multi-stage shift registers are used to delay one sampling frame or 31.25 microseconds for the 32 KHz sampling rate of the high rate sequence. A switch 11 is connected to both channels of PCM data which are received at the low rate sequence of 96 K samples per second and at the high rate sequence data of 384 K samples per second. The interpolating rate multiplier has a switch 12, a 24 multi-stage shift register 13 for accommodating twelve bit PCM signals, an adder 14, a multi-stage shift register 15 of 48 stages for 12 bit PCM signals, an adder 16 connected in series between the switch 11 and a high rate sampler 17 and a low rate sampler 18 as illustrated in FIG. 1.

In going from a high rate to a low rate, interpolation is performed by averaging the last four input samples. Rate division is then accomplished by discarding three out of every four interpolated values. In converting a low rate to a high rate, multiplication is accomplished by a novel feedback technique. Switch 12 alternatively connects the input of register 13 to switch 11 and to the output of register 13. Switch 12 feeds back the output of register 13 into its input during three out of every four output sample periods. For example, Channel No. 1 will appear at the input every 125 microseconds. However, for rate multiplication, samples are required every 31.25 microseconds. The first shift register 13 delays all the samples by 31.25 microseconds. When switch 12 is in its recirculate position, the original input from Channel No. 1 will be exiting the shift register 13, 31.25 microseconds after it first arrived. Switch 12 will enter it back into the shift register 13 where it is picked up the second and third time by the recirculating switch 12. Four samples later (125 microseconds) a new input will be available and the switch will be placed in its input position to accept a new sample from switch 11.

FIG. 2 illustrates the operational relationship of the switches, adders and shift registers. A load/recirculate control signal from a load/recirculate control 110 is shown at the top of FIG. 2. This signal controls operation of switch 12. It is received through an OR gate 19 whose other input receives signals from a source 21 of multiply/divide control signals. The distance between pulses can be seen to vary over the 125 microsecond frame. This is necessary because of the regular appearance of 12 PCM samples in each frame. In FIG. 2, below and above the load/recirculate control pulses, are positioned the channel number of the PCM samples being applied to the interpolator. The waveform is low when data is being recirculated, and when no data is being accepted for input. When it is high, data is being accepted for input. The output high data rate is exactly four times the low input data rate. There are four distinct phases between the arrival of each low data rate PCM sample. A sequence of numbers is shown below the load recirculate control pulses. These are the channel numbers that are being processed in the order shown. A different channel occupies each of the four distinct phases. Three samples of each of the four phases can then provide for a total of 12 high data rate samples.

Following the sequence shown, Channel No. 1 is the first input then Channels Nos. 4, 7, and 10 are recirculated. Channel No. 2 is then applied and Channels Nos. 5, 8, and 11 are recirculated. Channel No. 3 is then loaded and Channels Nos. 6, 9 and 12 are recirculated. After 12 channels have been thus processed at the high data rate, Channel No. 1 is recirculated followed by Channel No. 4 being loaded and Channels Nos. 7, 10 and 2 recirculate. Next, Channel No. 5 is loaded and Channels Nos. 8, 11 and 3 recirculate. Channel No. 6 is then loaded and Channels Nos. 9, 12, 1 and 4 recirculate. The channel order at the high data rate has been shuffled. However, it remains constant in that data rate. The reordering in most applications is not detrimental. If desired, simple transfer logic can place the channels back in their original order. This is done in some military equipment but is not normally done in commercial applications.

For simplicity, the operation of the data being received at a high data rate by Channel No. 1 will be specifically described, with the understanding that the other channels operate in like manner. Referring to both FIGS. 1 and 2, when a low rate signal sample $L_{n-1}$ leaves switch 12 and enters multiple shift register 13 during loading, this signal is also applied to adder 14 by the direct interconnecting wiring shown in FIG. 1. Thus, the adder 14 adds a signal $L_{n-1}$ to a signal $L_{n-2}$ which is received simultaneously from shift register 13 to produce quantity $L_{n-1} + L_{n-2}$ at its output. During each of the recyclings of Channel No. 1 through shift register 13 and switch 12 quantity $L_{n-1}$ will be circulated and therefore added to itself to provide $2 L_{n-1}$. At the time $L_{n-1}$ is added to $L_{n-2}$ for the first time the output of the adder 16 will be $L_{n-1} + L_{n-2} + 2 L_{n-2}$ or $L_{n-1} + 3 L_{n-2}$. Roughly, Channel No. 1 adder 16 output provides four interpolated PCM outputs for every low rate PCM input signal. In interpolating between signals it provides four times the first signal, then three times that signal plus a single value for the next input signal, then two of the first signal plus two of the second signal, then one of the first signal and three of the second signal and finally four times the second signal. As can be seen in FIG. 2, this process is then repeated. The output of these signals are transmitted from adder 16 to the high rate sampler 17 for conversion into a pulse stram as more extensively described in my co-pending application for "A Digital Filter For Pulse Code Modulation Signals," Ser. No. 647,537, filed Jan. 8, 1976.

The operation for the conversion of high rate signals to low rate signals will now be described. For every low rate cycle of 125 microseconds, four high rate signal samples are received by switch 11 and transmitted to switch 12. In FIG. 2, a series of such output signals from switch 11 to switch 12 are shown as signals $H_{m-7}$ through $H_m$. When signal $H_{m-4}$ is being received and therefore loaded into multiple shift register 13, it is being also applied to adder 14 which receives the last high rate signal $H_{m-5}$ and adds them together to produce the quantity $H_{m-4} + H_{m-5}$. From this point, the former quantity of $H_{m-6} + H_{m-7}$ which has been shifting through multiple shift register 15 arrives at adder 16 which now, through the direct wiring between the output of adder 14 to input of adder 16, adds the quantity $H_{m-4} + H_{m-5}$ to provide a total quantity of $H_{m-4} + H_{m-5} + H_{m-6} + H_{m-7}$.

At the next loading period, at which time $H_{m-3}$ is loaded into register 13, and when the subsequent signals $H_{m-2}$ and $H_{m-1}$ are being loaded, the output of adder 16 is discarded and a new signal is not produced until the time when the input signal $H_m$ is being loaded. The output of adder 16 is then the quantity $H_m + H_{m-1} + H_{m-2} + H_{m-3}$. Thus, the addition of each subsequent groups of four input samples is transferred from adder 16 to low rate sampler 18 which produces a low rate 8,000 KHz stream of voltage pulses similar to the ones produced by the rate samples in my aforestated co-pending application.

The operations just described were related to the passage of a single channel through the interpolating rate multiplier (or divider). That channel's sampling rate was divided (or multiplied) from 32 KHz to 8 KHz. The processor is actually operating on multiple time division multiplexed channels to perform 12 rate divisions and 12 rate multiplications between 384 K and 96 K samples per second.

Therefore, the multiple shift registers 13 and the adder 14 provide an initial interpolator, and shift register 15 and 16 provide an interpolator which handles added pairs from the first interpolator to provide the unique method of using the same circuits for PCM rate multiplication and division. Those skilled in the art will recognize that the same technique could be used to make greater multiplication and divisions that the one-to-four and four-to-one conversions illustrated. For example, an 8-to-64 KHz conversion could be made by using additional registers and adders. While the interpolating rate multiplier performs a complex sampling rate conversion and averaging process, it uses relatively simple circuit components. Although a load/recirculate control is complex, its instrumentation is simple and provides for a large reduction of complexity as compared to independent filters and rate conversion circuitry.

I claim:
1. An interpolating rate multiplier for processing pulse code modulation signals comprising:
   a. a digital pulse code modulation switch having a first input, a second input, and an output;
   b. a first multi-stage register coupled to said output of said switch and having a predetermined number of stages, one being an output stage;
   c. a first adder connected to said output stage of said first shift register and to said switch output;
   d. a direct connection between said first register output stage and said second switch input;
   e. a second multi-stage shift register having twice said predetermined number of stages, one being an output stage, and being connected to the output of said first adder;
   f. a second adder connected to said output stage of said second shift register and to the output of said first adder; and g. clock means connected to said first and second multistage shift registers to shift pulse code modulation signals at a predetermind rate.

2. In combination with the interpolating rate multiplier specified in claim 1:
   a. means receiving pulse code modulation signals at one-fourth said predetermined rate connected to said first input of said switch; and
   b. control means connected to said switch to connect said switch output to said second switch input during each second, third, and fourth shifts of a four shift sequence at said predetermined rate and to connect said switch output to said first switch input during said each first shift of said four shift sequence at said predetermined rate.

3. In combination with the interpolating rate multiplier specified in claim 2:
   gating means connected to the output of said second adder to transfer pulse code modulation signals at said predetermined rate.

4. In combination with the interpolating rate multiplier specified in claim 1:
   gating means connected to the output of said second adder to transfer every fourth pulse code modulation signal received at said predetermined rate.

5. An interpolating rate multiplier for processing pulse code modulation signals comprising:
   a. a digital pulse code modulation switch having a first input, a second input, and an output;
   b. a first multi-stage shift register coupled to said output of said switch and having a predetermined number of stages, one being an output stage;
   c. a first adder connected to said output stage of said first shift register and to said switch output;
   d. a direct connection between said first register output stage and said second switch input;
   e. a second multi-stage shift register having twice said predetermined number of stages, one being an output stage and being connected to the output of said first adder; and
   f. a second adder connected to said output stage of said second shift register and to the output of said first adder;
   g. a first source of pulse code modulation signals generated at said predetermined rate;
   h. a second source of pulse code modulation signals generated at one-fourth said predetermined rate;
   i. switch means connected to both said signal sources and to said first input of the digital pulse code modulation switch to interleave signals from both sources at said predetermined rate; and
   j. clock means connected to said first and second multistage shift registers to shift pulse code modulation signals at a rate equal to twice said predetermined rate.

6. In combination with the interpolating rate multiplier specified in claim 5:
   control means connected to said switch and to said switch means to connect said switch output to said first switch input during a receiving period of each signal from said first source and once during the four receiving periods of each signal from said second source.

7. In combination with the interpolating rate multiplier specified in claim 6:
   a. first gating means connected to the output of said second adder to transfer alternate pulse code modulation signals received from the second adder at said predetermined rate; and
   b. second gating means connected to the output of said second adder to transfer every eighth pulse code modulation signal received from the second adder.

8. An interpolating rate multiplier for processing pulse code modulation signals comprising:
   a. a digital pulse code modulation switch having a first input, a second input, and an output;
   b. a first multi-stage shift register coupled to said output of said switch and having a predetermined number of stages, one being an output stage;
   c. a first adder connected to said output stage of said first shift register and to said switch output;
   d. a direct connection between said first register output stage and said second switch input;
   e. a second multi-stage shift register having twice said predetermined number of stages, one being an output stage, and being connected to the output of said first adder;
   f. a second adder connected to said output stage of said second shift register and to the output of said first adder;
   g. a first source of m multiplex channels of pulse code modulation signals generated at said predetermined rate;
   h. a second source of n multiplex channels of pulse code modulation signals generated at one-fourth said predetermined rate;
   i. switch means connected to both said signal sources and to said first input of the digital pulse code modulation switch to interleave signals from both sources at said predetermined rate; and
   j. clock means connected to said first and second multistage shift registers and to said first and second adders to shift pulse code modulation signals at a rate equal to the sum of m plus, n multiplied by said predetermined rate.

9. In combination with the interpolating rate multiplier specified in claim 8:
   control means connected to said switch and to said switch means to connect said switch output to said first switch input during a receiving period of each signal from said first source and one during the four receiving periods of each signal from said second source.

10. In combination with the interpolating rate multiplier specified in claim 9:
    a. first gating means connected to the output of said second adder to transfer pulse code modulation signals received from the second adder, corresponding to second source signals, at said predetermined rate; and
    b. second gating means connected to the output of said second adder to transfer every eighth pulse code modulation signal corresponding to said first source signals received from the second adder.

11. A method of interpolating multiplexed pulse code modulation signals comprising:
    a. receiving a first pulse code modulation signal from a predetermined multiplexed channel;
    b. storing said signal sequentially in a series of memories equal in number to the number of multiplexed channels to be processed;
    c. adding said serially stored signal to a second received pulse code modulation signal from said predetermined channel to produce a first order sum pulse code modulation signal;

storing said first order sum pulse code modulation signal sequentially in a series of memories equal in number to twice the number of multiplexed channels to be processed;

e. adding said serially stored first order sum pulse code modulation signal to a second first order sum pulse code modulation signal from said predetermined channel to produce a second order sum pulse code modulation signal.

12. In combination with the method specified in claim 11, the additional steps of:

a. recirculating said serially stored signal sequentially through said series of memories equal in number to the number of multiplexed channels to be processed;

b. adding said serially stored and recycled signal to itself to provide a double value signal three times between adding said stored signal to a second received pulse code modulation signal from said predetermined multiplexed channel; and c. storing said double value signal in said series of memories equal to twice the number of multiplexed channels to be processed each time said double signal is produced.

13. In combination with the method specified in claim 11, the additional steps of:

discarding the last three of every four second order sum pulse code modulation signals.

14. An interpolating rate multiplier for processing pulse code modulation signals comprising:

a switch having a first input for receiving said pulse code modulation signals and a second input for receiving recirculated pulse code modulation signals;

a digital filter comprising multi-stage shift register delay means coupled to said switch and an adder coupled to said switch and to the output of said shift register delay means; and means coupling said output of said shift register delay means to said second input of said switch to present delayed pulse code modulation signals thereat.

15. The combination as claimed in claim 14, further comprising:

a second digital filter comprising second multi-stage shift register delay means coupled to the output of said adder and a second adder coupled to the output of said first adder and to the output of said second shift register delay means.

16. An interpolating rate multiplier for processing pulse code modulation signals having a preselected data frame interval comprising:

a switch having first and second inputs and an output, said first input receiving said pulse code modulation signals;

digital delay means coupled to said output of said switch for delaying signals thereat for a period equal to a preselected integral fraction of said data frame interval;

means coupling the output of said digital delay means to said second input of said switch;

an adder coupled to said output of said switch and the output of said digital delay means; and control means coupled to said switch for operating said switch to couple said first and second inputs to said output in a prearranged sequence during each data frame interval to present a correspondingly prearranged sequence of original and delayed pulse code modulation signals to said digital delay means and to said adder, whereby the output of said adder comprises interpolated, rate multiplied versions of said original pulse code modulation signals.

17. The combination as claimed in claim 16, further comprising:

a second digital delay means coupled to the output of said adder for delaying signals thereat for a second period twice the length of said period of said digital delay means; and a second adder coupled to the output of said adder and to the output of said second digital delay means to produce further interpolated, rate multiplied versions of said original pulse code modulation signals.

* * * * *